(12) United States Patent
Zhu et al.

(10) Patent No.: US 9,287,347 B2
(45) Date of Patent: Mar. 15, 2016

(54) METAL-INSULATOR-METAL CAPACITOR UNDER REDISTRIBUTION LAYER

(71) Applicant: QUALCOMM Incorporated, San Diego, CA (US)

(72) Inventors: John J. Zhu, San Diego, CA (US); P R Chidambaram, San Diego, CA (US); Giridhar Nallapati, San Diego, CA (US); Choh fei Yeap, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 84 days.

(21) Appl. No.: 13/765,015

(22) Filed: Feb. 12, 2013

(65) Prior Publication Data
US 2014/0225224 A1    Aug. 14, 2014

(51) Int. Cl.
*H01L 29/49* (2006.01)
*H01L 49/02* (2006.01)
*H01L 23/64* (2006.01)
*H01L 23/522* (2006.01)

(52) U.S. Cl.
CPC .......... *H01L 28/40* (2013.01); *H01L 23/5223* (2013.01); *H01L 23/642* (2013.01); *H01L 28/60* (2013.01); *H01L 2924/0002* (2013.01)

(58) Field of Classification Search
CPC .......... H01L 23/13; H01L 24/81; H01L 23/88
See application file for complete search history.

(56) References Cited

U.S. PATENT DOCUMENTS

| 7,118,985 | B2 | 10/2006 | Allman et al. |
| 7,362,560 | B2 | 4/2008 | Tsujimura et al. |
| 7,777,300 | B2 | 8/2010 | Tews et al. |
| 7,781,879 | B1 | 8/2010 | Rahman et al. |
| 8,791,543 | B2 * | 7/2014 | Lenive et al. ............ 257/528 |
| 2010/0019347 | A1 | 1/2010 | McLellan et al. |

* cited by examiner

*Primary Examiner* — Michael Shingleton
(74) *Attorney, Agent, or Firm* — Seyfarth Shaw LLP

(57) ABSTRACT

A metal-insulator-metal (MIM) capacitor reduces a number of masks and processing steps compared to conventional techniques. A first conductive layer of a MIM capacitor is deposited on a semiconductor chip and patterned using a MIM conductive layer mask. A conductive redistribution layer (RDL) is patterned over the MIM dielectric layer. The conductive redistribution layer includes two RDL nodes that overlap the first conductive layer of the MIM capacitor. A conductive via or bump extends through the MIM dielectric layer and couples one of the RDL nodes to the first conductive layer of the MIM capacitor.

9 Claims, 7 Drawing Sheets

METAL-INSULATOR-METAL CAPACITOR UNDER REDISTRIBUTION LAYER

TECHNICAL FIELD

The present disclosure generally relates to integrated circuits. More specifically, the present disclosure relates to efficiently fabricating capacitors.

BACKGROUND

Metal-insulator-metal (MIM) capacitors are frequently employed in semiconductor dies to provide capacitance to circuitry on the semiconductor die. For example, MIM capacitors are added to semiconductor dies having radio frequency (RF) circuitry to provide bypass capacitance. MIM capacitors are increasingly used to improve performance of devices that operate at increasingly higher frequencies. However, the fabrication of MIM capacitors usually increases the cost of producing a semiconductor die by increasing the number of processing steps and increases the number of masks used to produce a die, for example.

MIM capacitors are usually formed between two interconnect metal layers of a semiconductor die. FIG. 1 is a cross-sectional view illustrating an example of a conventional MIM capacitor structure 100 on a semiconductor die. In the conventional MIM capacitor structure 100, a bottom node 102 and a top node 104 of a MIM capacitor are separated by a dielectric layer 106. The bottom node 102 and top node 104 of the MIM capacitor are built between a first metal (Mx) layer 108 and a second metal (Mx+1; layer 110 of the semiconductor die. The first metal layer 108 and second metal layer 110 are patterned by respective masks to build conventional distribution and interconnection paths on the die, for example. A first additional mask is used during a first additional patterning process to pattern the bottom node 102 of the MIM capacitor. A second additional mask is used during a second additional patterning step to pattern the top node 104 of the MIM capacitor.

A first layer (Vx) of conductive vias 112 may be formed to provide coupling or connection between the first metal layer 108 and the second metal layer 110. In this example of a conventional MIM capacitor structure 100, additional conductive vias 114, 116 are formed to couple the top node 104 of the MIM capacitor to one path of the second metal layer 110, and to couple the bottom node 102 to another path of the second metal layer 110.

FIG. 2 is a cross-sectional view illustrating another example of a conventional MIM capacitor structure 200 on a semiconductor die. In the conventional MIM capacitor structure 200, a bottom node 202 and a top node 204 of a MIM capacitor are separated by a dielectric layer 206. The bottom node 202 and top node 204 of the MIM capacitor are built between a first metal (Mx) layer 208 and a second metal (Mx+1) layer 210 of the semiconductor die. The first metal layer 208 and second metal layer 210 are patterned by respective masks to build conventional distribution and interconnection paths on the die, for example. A first additional mask is used during a first additional patterning process to pattern the bottom node 202 of the MIM capacitor. A second additional mask is used during a second additional patterning step to pattern the top node 204 of the MIM capacitor.

A first layer (Vx) of conductive vias 212, 214 may be formed to provide coupling between the first metal layer 208 and the second metal layer 210. In this example of a conventional MIM capacitor structure 200, the conductive vias 212, 214 are formed to couple the top node 204 of the MIM capacitor to one path of the second metal layer 210, and to couple the bottom node 202 to another path of the second metal layer 210. Because the conductive vias 212, 214 extends through the top node 204 and bottom node 206, respectively, the top node 204 and bottom node 202 of the MIM capacitor are coupled to the sidewalls of the respective conductive vias 212, 214. This type of coupling is referred to as sidewall coupling.

The use of a first additional mask and a second additional mask to pattern the top nodes and bottom nodes of MIM capacitors between metal layers in a semiconductor die may significantly increases the cost of the die. Additionally, forming MIM capacitors between two interconnect metal layers has caused packaging problems and reduced mechanical reliability.

BRIEF SUMMARY

According to an aspect of the present disclosure, a method of constructing a metal-insulator-metal (MIM) capacitor includes depositing a MIM capacitor conductive layer on a semiconductor chip, patterning the MIM capacitor conductive layer using a single MIM capacitor mask, and depositing a MIM dielectric layer on the MIM capacitor conductive layer. The method also includes patterning a redistribution layer (RDL) on the MIM dielectric layer and fabricating a conductive inter-layer pathway that couples to the MIM capacitor conductive layer. According to this aspect of the disclosure, the redistribution layer includes a first RDL node overlapping the MIM capacitor conductive layer and a second RDL node overlapping the MIM capacitor conductive layer.

According to another aspect of the present disclosure, a metal-insulator-metal (MIM) capacitor apparatus includes a conductive redistribution layer (RDL) that includes a first conductive redistribution layer node and a second conductive redistribution layer node. The apparatus also includes a MIM capacitor conductive layer overlapping with both the first conductive redistribution layer node and the second conductive redistribution layer node, and a dielectric layer between the MIM capacitor conductive layer and the first conductive redistribution layer node. The apparatus also has a conductive inter-layer pathway coupled to the MIM capacitor conductive layer.

Another aspect of the present disclosure includes a metal-insulator-metal (MIM) capacitor apparatus including means for providing a dielectric barrier between a MIM capacitor conductive layer and first conductive redistribution layer (RDL) node overlapping the MIM capacitor conductive layer; and means for coupling the MIM capacitor conducive layer to a second conductive RDL node overlapping the MIM capacitor conducive layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
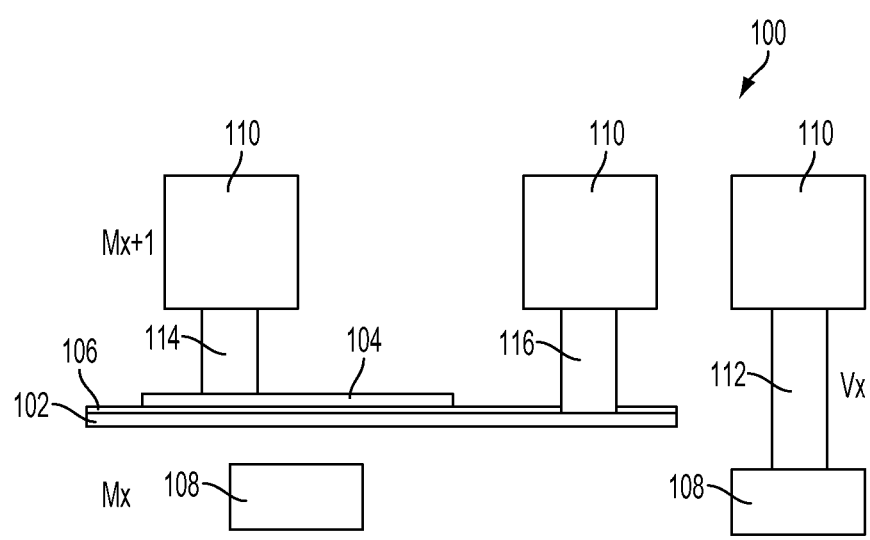
FIG. 1 is a cross-sectional view drawing illustrating an example of a conventional MIM capacitor structure on a semiconductor die.
Figure 2:
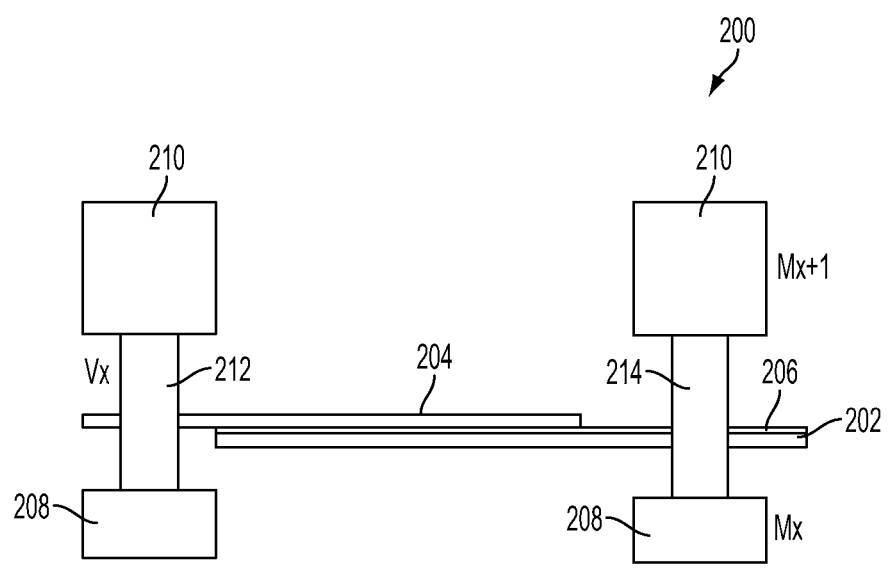
FIG. 2 is a cross-sectional view drawing illustrating an example of a conventional MIM capacitor structure on a semiconductor die.
Figure 3:
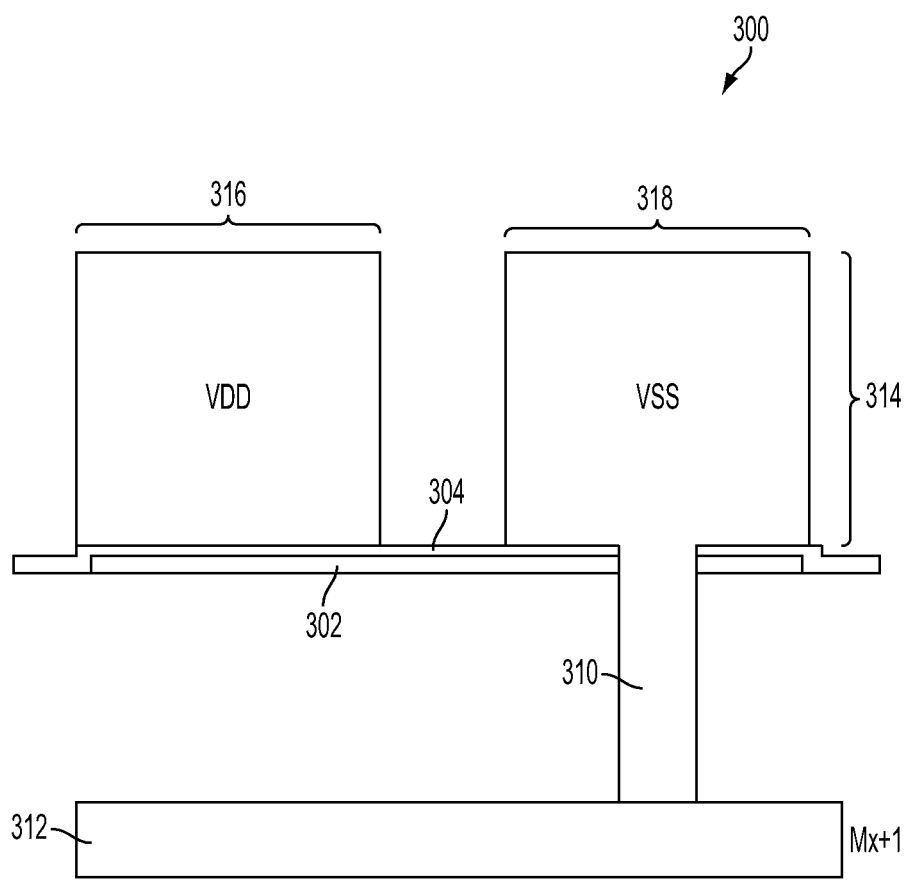
FIG. 3 is a cross-sectional view drawing illustrating a MIM capacitor structure according to an aspect of the present disclosure.

Aspects of the present disclosure include MIM capacitor structures that can be fabricated using techniques that reduce the number of masks and processes compared to conventional MIM structures. FIG. 3 is a cross sectional view illustrating a MIM capacitor structure 300 according to an aspect of the present disclosure.

The MIM capacitor structure 300 includes a bottom node 302 and a top node 316 separated by a dielectric layer 304. The top node is provided by a first portion 316 of a conductive layer (e.g., redistribution layer) 314 on the semiconductor die. The bottom node 302 is coupled to a second portion 318 of the conductive layer 314 and a back end of line (BEOL) conductive layer Mx+1) 312 of the semiconductor die. The RDL 314 and BEOL conductive layer 312 are patterned by respective masks to build conventional distribution and interconnection paths on the die, for example. A first additional mask is used during first additional patterning process to pattern the bottom node 302 of the MIM capacitor. Although "metal" layers are described, any conductive layer could be used. Similarly, although a "metal-insulator-metal (MIM) capacitor" is described, the capacitor could be constructed with conductive nodes fabricated with materials other than metal.

According to aspects of the present disclosure, no second additional mask or second additional patterning step is used to pattern the top node 316 of the MIM capacitor. An inter-layer path (e.g., a conductive via) 310 provides coupling between a second portion 318 of the RDL 314 and the BEOL conductive layer 312. The first portion 316 may be a voltage drain (Vdd) path and the second portion 318 may be a voltage source (Vss) path, for example. The first portion 316 and second portion 318 may also be referred to as a first RDL node and a second node, respectively.

In this example of a MIM capacitor structure 300 according to aspects of the present disclosure, the conductive via 310 extends through the bottom node 302 and is coupled to the bottom node 302 via sidewall coupling, i.e., conductive connection of the thin film 302 to the sidewall of the conductive via 310. According to an aspect of the present disclosure, the inter-layer path (e.g., conductive via) 310 is formed using an existing via mask so that no additional mask is needed to form a via dedicated to only the MIM capacitor.

According to one aspect of the present disclosure, the conductive layer 314 may be a conductive redistribution layer, of, for example, aluminum (Al RDL layer). Conventional processing of the aluminum RDL gives the aluminum RDL a flatter bottom surface than other conductive layers. The flatter bottom surface allows the aluminum RDL to form a suitable node of the MIM capacitor structure 300.

Figure 4:
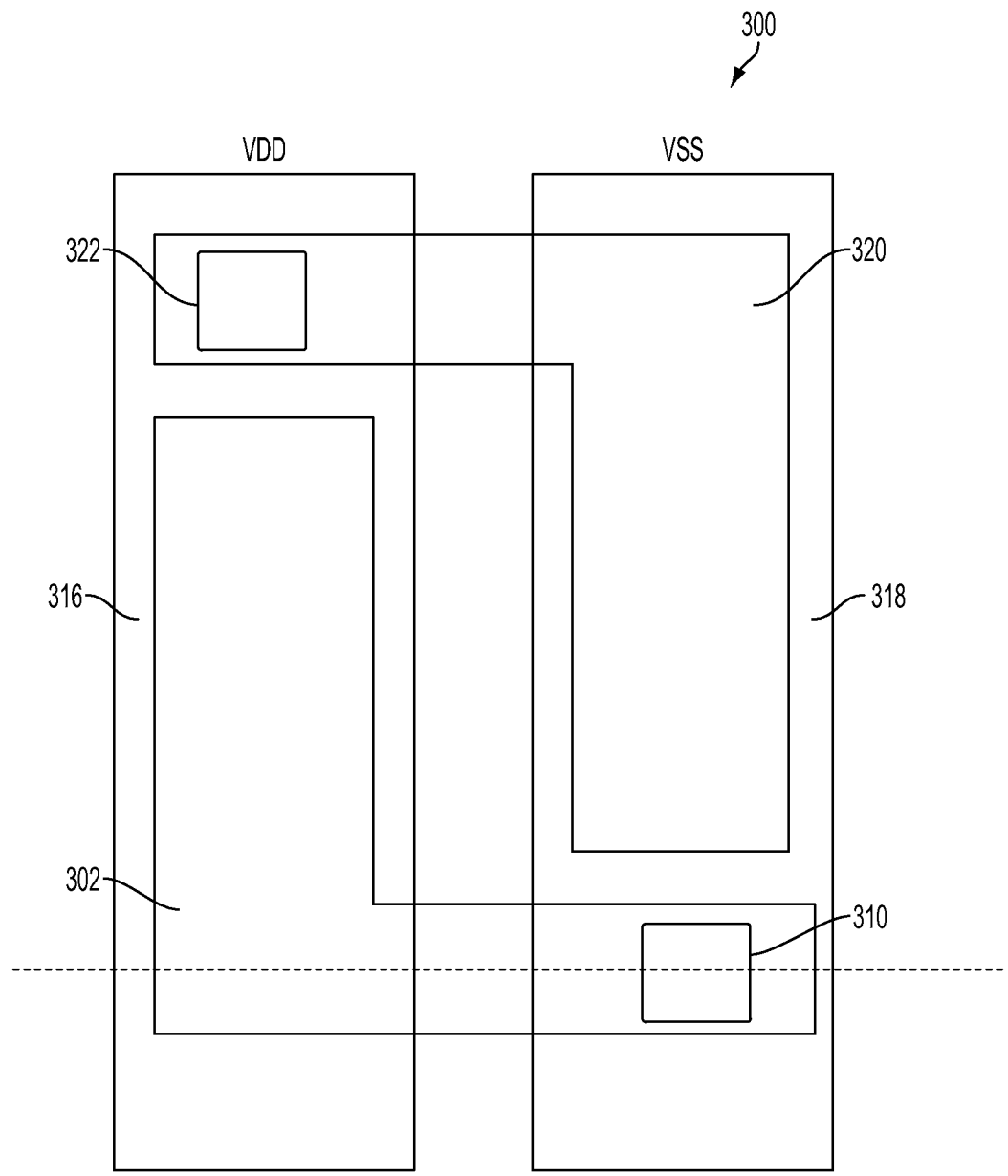
FIG. 4 is a top view drawing illustrating a MIM capacitor structure according to an aspect of the present disclosure.

FIG. 4 is a top view further illustrating the MIM capacitor structure 300 described above with reference to FIG. 3. According to this aspect of the present disclosure, the bottom node 302 extends under both the first portion 316 and the second portion 318 of the RDL 314 (FIG. 3). That is, the bottom node 302 overlaps with the first and second portions 316, 318. The conductive via 310 couples the second portion 318 of the RDL 314 to the bottom node 302 and/or to the BEOL layer 312 (FIG. 3) to enable electrical access to the bottom node 302. An optional second MIM capacitor is shown in which a second bottom node 320 extends under both the first portion 316 and the second portion 318 of the RDL 314 (FIG. 3). A second via 322 couples the second bottom node 320 to the first portion 316 of the RDL 314 (FIG. 3) and/or to the BEOL layer 312 (FIG. 3) in the same manner as the first via 310, for example. Although depicted as square shaped, the vias 310, 312 can be any shape including circular and could be structures other than vias, such as bumps.

Figure 5:
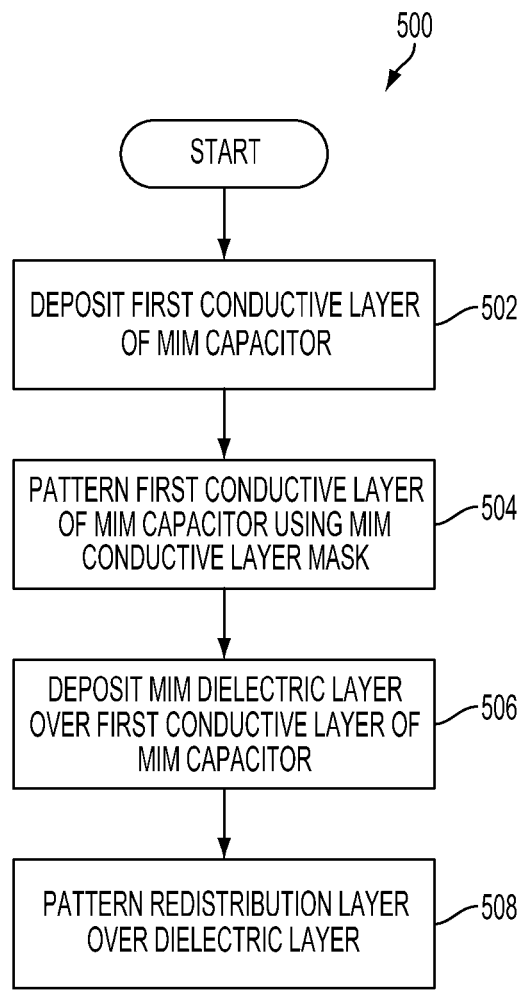
FIG. 5 is a process flow diagram illustrating a method for fabricating a MIM capacitor using according to aspects of the present disclosure.

Aspects of the present disclosure include a method for fabricating MIM capacitors, which reduces the number of masks, and processing steps compared to conventional techniques. FIG. 5 is a process flow diagram 500 illustrating an exemplary method for fabricating a MIM structure according to an aspect of the present disclosure. At block 502, a first conductive layer of a MIM capacitor is deposited on a semiconductor chip. At block 504, the first conductive layer of the MIM capacitor is patterned using a MIM conductive layer mask. At block 506, a MIM dielectric layer is deposited over the patterned first conductive layer of the MIM capacitor. At block 508, a conductive redistribution layer (RDL) is patterned over the MIM dielectric layer. According to aspects of the present disclosure, the conductive redistribution layer includes two RDL nodes that overlap the BEOL conductive layer of the MIM capacitor. Another aspect of the present disclosure includes forming a conductive via or bump that extends through the MIM dielectric layer and couples one of the RDL nodes to the first conductive layer of the MIM capacitor. The bump or via could also (or instead) couple the first conductive layer of the MIM capacitor to the BEOL layer. Thus, the first conductive layer of the MIM capacitor is electrically accessible.

Another aspect of the present disclosure includes a metal-insulator-metal (MIM) capacitor apparatus including means for providing a dielectric barrier between a MIM capacitor conductive layer and first conductive redistribution layer (RDL) node overlapping the MIM capacitor conductive layer and means for coupling the MIM capacitor conducive layer to a second conductive RDL node overlapping the MIM capacitor conducive layer. The means for providing the dielectric barrier between the MIM capacitor conductive layer and the first conductive redistribution layer (RDL) node may be a dielectric layer such as the dielectric layer 304 described above with reference to FIG. 3, for example. The means for coupling the MIM capacitor conducive layer to a second conductive RDL node may be an inter-layer pathway such as the conductive via 310 described above with reference to FIG. 3, for example According to another aspect of the present disclosure, the means for providing the dielectric barrier between the MIM capacitor conductive layer and the first conductive RDL, node may also include means for providing a dielectric barrier between the MIM capacitor conductive layer and the second RDL node. The means for providing the dielectric barrier between the MIM capacitor conductive layer and the second RDL node may also be the dielectric layer 304 described above with reference to FIG. 3, for example.

According to another aspect of the present disclosure, the means for coupling the MIM capacitor conductive layer to the second conductive RDL node also includes means for coupling the second conductive RDL, node to a back end of line (BEOL) conductive layer. The means for coupling the second conductive RDL node to the BEOL conductive layer may be an inter-layer pathway such as the conductive via 310 described above with reference to FIG. 3, for example.

Figure 6:
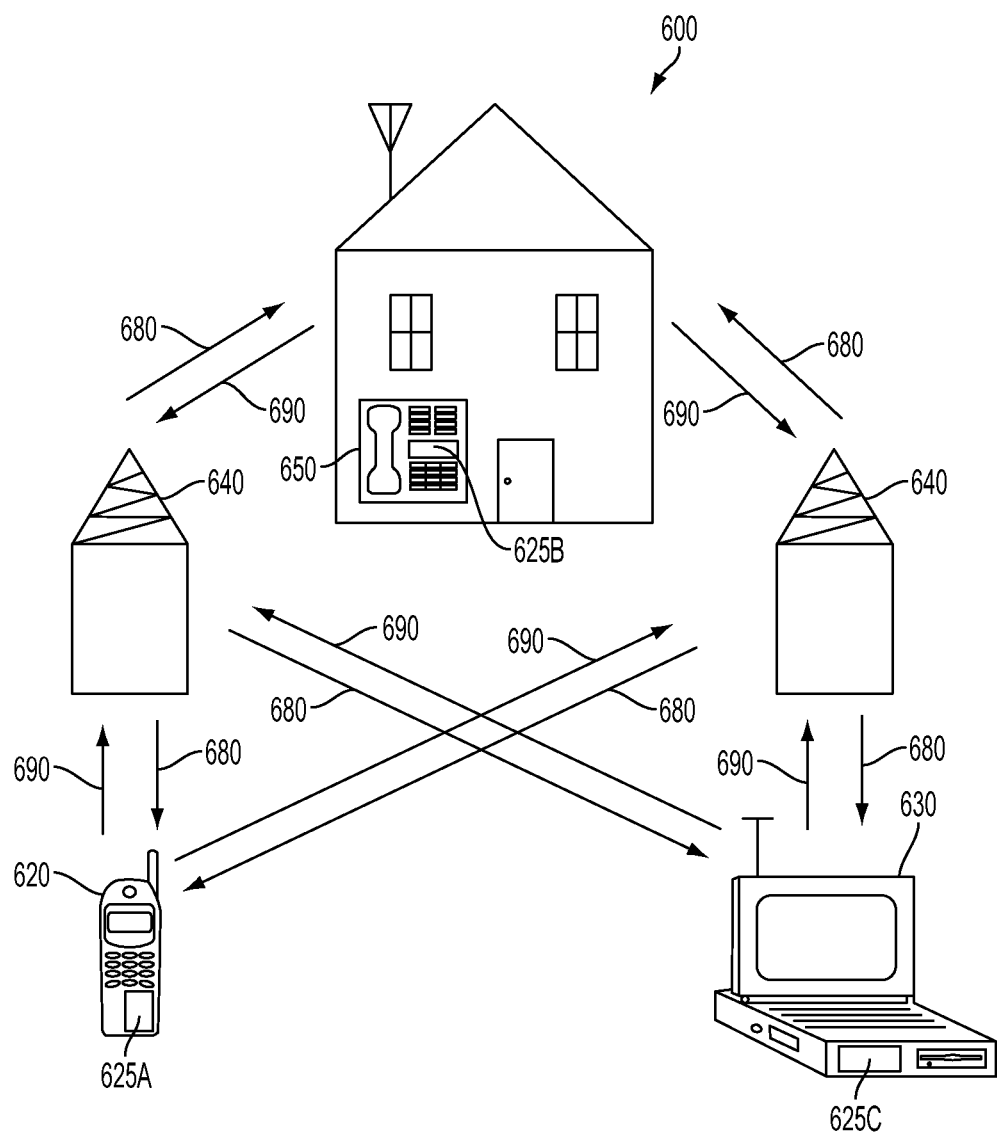
FIG. 6 is a block diagram showing an exemplary wireless communication system in which an embodiment of the disclosure may be advantageously employed.

FIG. 6 is a block diagram showing an exemplary wireless communication system 600 in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C, and 625B, which include the disclosed MIM capacitor. It will be recognized that any device containing an IC may also include the MIM capacitor structures disclosed here, including the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 6 illustrates remote units according to the teachings of the disclosure, the disclosure is not limited to these exemplary illustrated units. Embodiments of the disclosure may be suitably employed in any device, which includes semiconductor dies having MIM capacitors.

Figure 7:
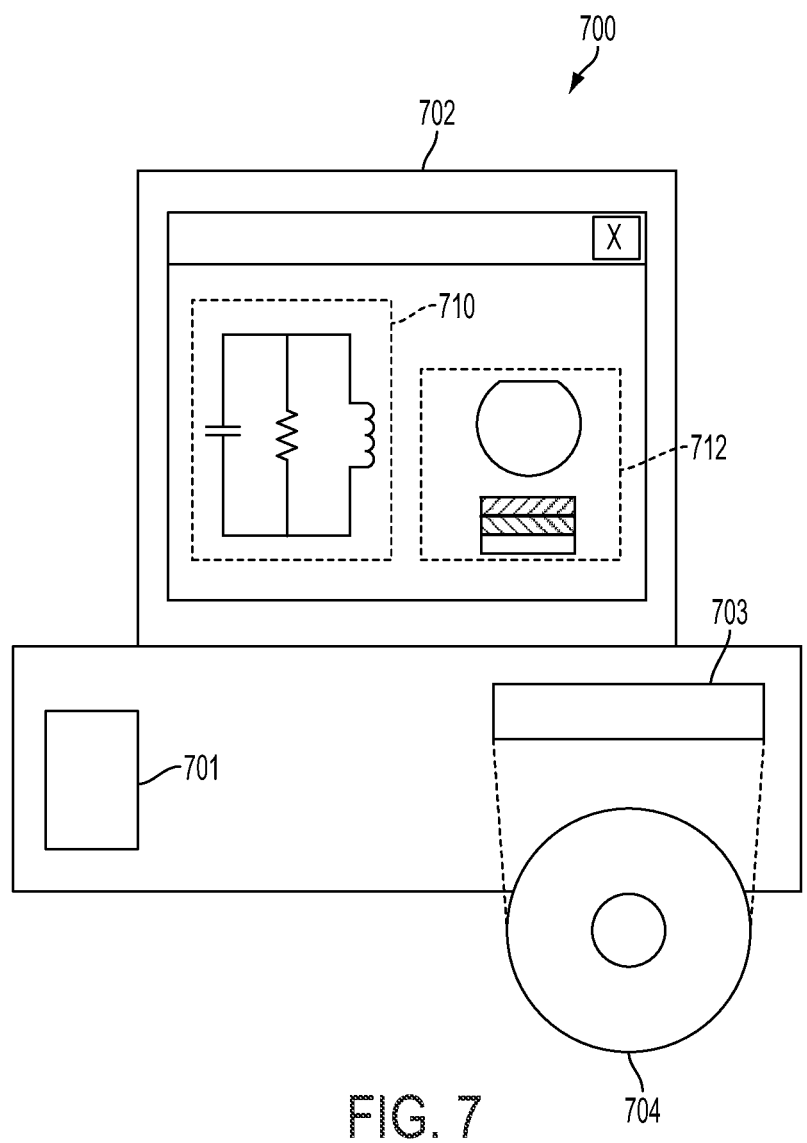
FIG. 7 is a block diagram illustrating a design workstation used for circuit, layout, and logic design of a semiconductor component according to one embodiment.

FIG. 7 is a block diagram illustrating a design workstation used for circuit, layout, and logic design of a semiconductor component, such as a MIM capacitor as disclosed above. A design workstation 700 includes a hard disk 701 containing operating system software, support files, and design software such as Cadence or OrCAD. The design workstation 700 also includes a display 702 to facilitate design of a circuit 710 or a semiconductor component 712 such as a packaged integrated circuit having MIM capacitor. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a. CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A metal-insulator-metal (MIM) capacitor apparatus, comprising:
   a conductive redistribution layer (RDL) including a first conductive redistribution layer node and a second conductive redistribution layer node;
   a MIM capacitor conductive layer overlapping with both the first conductive redistribution layer node and the second conductive redistribution layer node;
   a dielectric layer between the MIM capacitor conductive layer and the first conductive redistribution layer node; and
   a conductive inter-layer pathway coupled to the second conductive redistribution layer node and extending through the MIM capacitor conductive layer and through the dielectric layer.

2. The metal-insulator-metal (MIM) capacitor apparatus of claim 1, in which the conductive inter-layer pathway is coupled to a back end of line (BEOL) layer.

3. The metal-insulator-metal (MIM) capacitor apparatus of claim 1, in which the conductive RDL comprises a top aluminum RDL.

4. The metal-insulator-metal (MIM) capacitor apparatus of claim 1, in which the conductive inter-layer pathway comprises a via or a bump.

5. The metal-insulator-metal (MIM) capacitor apparatus of claim 1, in which the MIM capacitor is integrated into a mobile phone, a set top box, a music player, a video player, an entertainment unit, a navigation device, a computer, a hand-held personal communication systems (PCS) unit, a portable data unit, and/or a fixed location data unit.

6. A metal-insulator-metal (MIM) capacitor apparatus, comprising:
   means for providing a dielectric barrier between a MIM capacitor conductive layer and a first conductive redistribution layer (RDL) node overlapping the MIM capacitor conductive layer; and
   means for coupling the MIM capacitor conductive layer to a second conductive RDL node overlapping the MIM capacitor conductive layer, the coupling means extending through the MIM capacitor conductive layer and through the dielectric barrier providing means.

7. The MIM capacitor apparatus of claim 6, in which the means for providing the dielectric barrier between the MIM capacitor conductive layer and the first conductive RDL node further comprises means for providing a dielectric barrier between the MIM capacitor conductive layer and the second RDL node.

8. The MIM capacitor apparatus of claim 6, in which the means for coupling the MIM capacitor conductive layer to the second conductive RDL node further comprises means for coupling the second conductive RDL node to a back end of line (BEOL) conductive layer.

9. The MIM capacitor apparatus of claim 6, integrated into a mobile phone, a set top box, a music player, a video player, an entertainment unit, a navigation device, a computer, a hand-held personal communication systems (PCS) unit, a portable data unit, and/or a fixed location data unit.

* * * * *